United States Patent [19]

Walls et al.

[11] Patent Number: 4,851,319

[45] Date of Patent: Jul. 25, 1989

[54] RADIATION POLYMERIZABLE COMPOSITION, PHOTOGRAPHIC ELEMENT, AND METHOD OF MAKING ELEMENT WITH DIAZONIUM SALT, AND MONOFUNCTIONAL AND POLYFUNCTIONAL ACRYLIC MONOMERS

[75] Inventors: John E. Walls, Hampton; Carlos Tellechea, Shrewsbury, both of N.J.

[73] Assignee: Hoechst Celanese Corporation, Somerville, N.J.

[21] Appl. No.: 185,342

[22] Filed: Apr. 19, 1988

Related U.S. Application Data

[63] Continuation of Ser. No. 872,566, Jun. 10, 1986, abandoned, which is a continuation-in-part of Ser. No. 707,110, Feb. 28, 1985, abandoned.

[51] Int. Cl.[4] ............... G03C 1/54; G03C 1/60; G03C 1/68; G03C 1/74
[52] U.S. Cl. ................... 430/157; 430/169; 430/175; 430/176; 430/177; 430/281; 430/285; 430/920; 430/288
[58] Field of Search ............. 430/175, 176, 177, 281, 430/156, 920, 157, 169, 285, 288

[56] References Cited

U.S. PATENT DOCUMENTS

| | | | |
|---|---|---|---|
| 3,396,019 | 8/1968 | Uhlig | 430/175 |
| 3,679,419 | 7/1972 | Gillich | 430/175 |
| 3,905,815 | 9/1975 | Bonham | 430/152 |
| 3,953,309 | 4/1976 | Gilano et al. | 204/159.16 |
| 3,987,037 | 10/1976 | Bonham et al. | 430/281 |
| 4,228,232 | 10/1980 | Rousseau | 430/271 |
| 4,316,949 | 2/1982 | Petrellis et al. | 430/175 |
| 4,330,590 | 5/1982 | Vesley | 430/281 |
| 4,459,192 | 7/1984 | Via | 430/175 |

FOREIGN PATENT DOCUMENTS

| | | | |
|---|---|---|---|
| 1153236 | 6/1983 | Canada | 430/175 |
| 57-196230 | 12/1982 | Japan | 430/175 |
| 2044788 | 10/1980 | United Kingdom | 430/175 |

OTHER PUBLICATIONS

Research Disclosure, Abstract #16767, "Photopolymerisable Material"–disclosed by C. Corcoran & C. Withers, p. 15, 3/1978.

*Primary Examiner*—Charles L. Bowers, Jr.
*Attorney, Agent, or Firm*—Richard S. Roberts

[57] ABSTRACT

This invention relates to a radiation polymerizable composition for use in a photographic element such as a lithographic printing plate comprising in admixture
a) a polymeric binder;
b) a photoinitiator;
c) a diazonium salt; and
d) a photopolymerizable mixture of
  i) a polyfunctional acrylic monomer having from 3 to 6 unsaturated groups; and
  ii) a monofunctional acrylic monomer having 1 unsaturated group.

31 Claims, No Drawings

RADIATION POLYMERIZABLE COMPOSITION, PHOTOGRAPHIC ELEMENT, AND METHOD OF MAKING ELEMENT WITH DIAZONIUM SALT, AND MONOFUNCTIONAL AND POLYFUNCTIONAL ACRYLIC MONOMERS

This application is a continuation of application Ser. No. 872,566 filed June 10, 1986, abandoned.

BACKGROUND OF THE INVENTION

The present invention relates to a radiation-polymerizable composition. More particularly, this invention relates to a radiation-polymerizable composition which may be employed to produce an improved photographic element such as a lithographic printing plate. Such plates show an increase of stability and press run life. The composition can be readily formed into adherent coatings useful in the graphic arts especially in the production of lithographic printing plates.

The use of radiation polymerizable coatings in the graphic arts is well known. Typically, the composition of such coatings can include a polymeric constituent, which may itself be radiation polymerizable, and a photosensitizer composition. Upon selected exposure of this coating to imaging energies, the radiation polymerizable species within the composition would either itself undergo a reaction or promote a reaction or degradation of one or more of the other components of the composition. It is, of course, readily appreciated that such reaction is only of value in such a system where it is essentially confined, or limited, to those areas of the composition impinged upon by such imaging energies. A negative working image thus created within the coating can then be "developed" by selective removal of the non-exposed components of the film or layer which have not been subjected to imaging energies. The ability to create such selective changes in coatings prepared from a radiation polymerizable composition has been appreciated for some time. The basic difference in the various approaches in the formulation of lithographic printing plates from radiation polymerizable compositions has been in the search for a system which is prepared from relatively inexpensive ingredients, does not require prolonged imaging cycles (has a high quantum efficiency), is able to undergo an increased number of press runs and results in the creation of high resolution images within the composition which can be manifested without prolonged and elaborate development.

Most such lithographic printing plates comprise a metal substrate which is coated with a light sensitive diazonium compound in admixture with suitable binding resins, photoinitiators, photopolymerizable compositions, colorants, stabilizers, exposure indicators, surfactants and the like.

Although the art is replete with photosensitive compositions which may be used for lithographic printing plates, the prior art composition's serviceability is restricted by their limited stability and number of press runs.

SUMMARY OF THE INVENTION

This invention relates to a radiation polymerizable composition for use in forming photographic elements such as lithographic printing plates, comprising in admixture (a) a polymeric binder;
(b) a photoinitiator;
(c) a diazonium salt; and
(d) a photopolymerizable mixture of
(i) a polyfunctional acrylic monomer having from 3 to 6 unsaturated groups; and
(ii) a monofunctional acrylic monomer having 1 unsaturated group.

DETAILED DESCRIPTION OF THE INVENTION

This invention relates to a radiation-polymerizable composition. More particularly, this invention relates to a radiation-polymerizable composition for use in forming photographic elements such as lithographic printing plates, which comprises in admixture (a) a polymeric binder;
(b) a photoinitiator;
(c) a diazonium salt; and
(d) a photopolymerizable mixture of
(i) a polyfunctional acrylic monomer having from 3 to 6 unsaturated groups; and
(ii) a monofunctional acrylic monomer having 1 unsaturated group.

The polymeric binder useful in the practice of this invention is preferably characterized as being a polymer which does not react with itself or other compounds when exposed to actinic radiation. The preferred binder resin should be substantially organic solvent soluble and is preferably one which is not substantially alkali, acid or water soluble. The binder must have a molecular weight sufficient to provide a tack-free surface when in admixture with the photopolymerizable mixture and to provide a tough cohesive matrix which when used to produce a lithographic printing plate is capable of providing numerous quality impressions. The molecular weight must be low enough, though, to permit solubility in formulation as well as during development. The molecular weight of the binder should be greater than about 20,000, preferably greater than about 30,000 and, most preferably, greater than about 40,000.

Examples of binders suitable for this invention include epoxy resins, polyvinyl acetate, polyvinyl acetals, polyesters, polyamides, polyethers, polyurethanes and polyacrylic resins which are either homo- or copolymers of acrylates (or methacrylates) and/or acrylic acid (or methacrylic acid). In the preferred embodiment, the polymeric binder is a terpolymer of polyvinyl acetate, polyvinyl alcohol and polyvinyl formal available as Formvar 12/85 available commercially from Monsanto of St. Louis, Mo.

Preferably, the polymeric binder is present in the composition at a percent solids level of from about 20% to about 75% by weight. A more preferred range is from about 30% to about 65% by weight and, most preferably, the polymeric binder is present at a percent solids level of from about 35% to about 50% by weight.

Suitable photoinitiators which may be used in this invention are preferably those free-radical photoinitiators having a maximum range of from about 320 to about 400 nm. Examples include the acetophenones, benzophenones, triazines, benzoins, benzoin ethers, xanthones, thioxanthones, acridines and benzoquinones. More preferred of these are the triazines having the formula

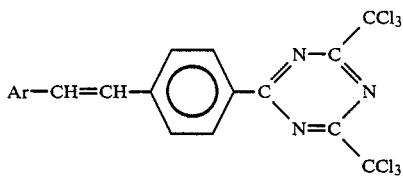

wherein Ar is

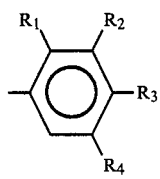

and $R_1$, $R_2$, $R_3$ and $R_4$ are, independently, hydrogen, chlorine, bromine, alkoxy, alkyl ketone, naphthyl or anthracyl, especially bis-trichloromethyl triazine. The most preferred photoinitiator is 2-stilbenyl-4,6-di(trichloromethyl) triazine.

The photoinitiator is preferably present in the composition at a percent solids level of about 1.5% to about 8.0% by weight, more preferably about 2.0% to about 6.0% by weight and is most preferably present at a percent solids level of from about 3.0% to about 4.0% by weight.

The diazonium salt which is useful in the practice of this invention may be any suitable light-sensitive diazonium polymeric or monomeric compound which are well known to the skilled artisan although the polymeric diazonium compounds are preferred. Suitable diazonium compounds include those condensed with formaldehyde such as disclosed in U.S. Pat. Nos. 2,063,631 and 2,667,415, the polycondensation products such as disclosed in U.S. Pat. Nos. 3,849,392 and 3,867,147, and the high speed diazos such as disclosed in U.S. Pat. No. 4,436,804, all of which are hereby incorporated herein by reference.

Preferably, the diazonium salt comprises the 1:1 polycondensation product of 3-methoxy-4-diazo-diphenyl amine sulfate and 4,4'-bis-methoxy-methyl-diphenyl ether, precipitated as the mesitylene sulfonate, such as is taught in U.S. Pat. No. 3,849,392.

The diazonium salt is preferably present in the composition of the subject invention at a percent solids level of from about 3% to about 20% by weight. More preferably it is present at about 5% to about 18% by weight and most preferably the diazonium salt is present at a percent solids level of from about 10% to about 15% by weight.

The photopolymerizable mixture of the subject invention is comprised of, in admixture, a polyfunctional acrylic monomer which has from 3 to 6 unsaturated groups and a monofunctional acrylic monomer which has 1 unsaturated group.

The polyfunctional acrylic monomer is an ethylenically unsaturated compound having from three to six unsaturated groups and being capable of reacting with the monofunctional acrylic monomer upon exposure to imaging radiation. The polyfunctional monomer is characterized as having the unsaturated groups being acrylate or methacrylate esters. The preferred monomer is either a solid or liquid having a viscosity of greater than about 700 cps at 25° C., preferably greater than about 2000 cps at 25° C. Most preferably, the monomer has a viscosity of greater than about 4000 cps at 25° C.

Examples of compounds which are suitable for use as the polyfunctional acrylic monomer of this invention include trimethyl propane triacrylate and the ethoxylated or propoxylated analogs thereof, trimethylol propane tri-methacrylate and the ethoxylated or propoxylated analogs thereof, pentaerythritol triacrylate, pentaerythritol trimethacrylate, dipentaerythritol monohydroxy pentaacrylate, dipentaerythritol monohydroxy pentamethacrylate, dipentaerythritol hexaacrylate, dipentaerythritol hexamethacrylate, pentaerythritol tetracrylate and pentaerythritol tetramethacrylate. Preferably, the monomer is pentaerythritol tetraacrylate, although a combination of suitable monomers is also advantageous.

The monofunctional monomer is an ethylenically unsaturated compound having one unsaturated group and is capable of reacting with the polyfunctional monomer upon exposure to imaging radiation. The monofunctional monomer is characterized as having the unsaturated group being an acrylate or methacrylate ester. Preferably, the monofunctional monomer is a liquid having a viscosity in the range of from about 1 to about 25 cps at 25° C.

Examples of compounds which are suitable for use as the monofunctional monomer of this invention include trimethylol propane monoacrylate and the ethoxylated or propoxylated analogs thereof, trimethylol propane monomethacrylate and the ethoxylated or propoxylated ananlogs thereof, pentaerythritol acrylate, pentaerythritol methacrylate, tetrahydro furfuryl acrylate, tetrahydro furfuryl methacrylate, cyclohexyl acrylate, cyclohexyl methacrylate, n-hexyl acrylate, n-hexyl methacrylate, glycidyl acrylate and glycidyl methacrylate. Preferably, the monomer is pentaerythritol acrylate, although a combination of suitable monomers is also advantageous.

In the photopolymerizable mixture of this invention the polyfunctional monomer should be present in an amount of more than at least about 50% and, more preferably, should be present in an amount of from about 65% to about 99%, more preferably from about 80% to about 97.5%. The monofunctional monomer should comprise the balance of the photopolymerizable mixture. The photopolymerizable mixture is present at a percent solids level which is preferably in the range of from about 20% to about 70% by weight. More preferably, the photopolymerizable mixture is present at a percent solids level of from about 30% to about 60% by weight and most preferably from about 30% to about 50% by weight.

One of the advantages in having a polyfunctional monomer in the photopolymerizable mixture in combination with a monofunctional monomer is that the 3-dimensional structure provided by the polyfunctinal monomer provides good matrix integrity allowing for a tough image and the linear propagation provided by the monofunctional monomer provides good photospeed. If the photopolymerizable mixture was comprised of two polyfunctional acrylic monomers, the resulting image would have good toughness but poor photospeed. If the mixture was comprised of two monofunctional acrylic monomers, there would be good photospeed but poor image toughness.

One of the significant aspects of this invention is that the unique combination of photoinitiator, diazonium salt and photopolymerizable mixture reduces the need for use of an oxygen barrier layer or the necessity for processing in a nitrogen barrier environment, although the exact mechanism for this in unclear. Among the possible advantages derived thereby is elimination of (1) the inconvenience of applying a second coating, (2) the concern over the refractive index and solubility of the oxygen barrier layer, (3) the concern over blinding on a printing press due to residue from the oxygen barrier layer, and (4) the concern over potential image gain due to the oxygen barrier layer.

Other components which may be included in the radiation-polymerizable composition of this invention include acid stabilizers, exposure indicators, plasticizers, photoactivators and colorants.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid, and mixtures thereof. Preferably, the acid stabilizer is phosphoric acid. When used, the acid stabilizer is preferably present in the radiation-polymerizable composition in the amount of from about 0.3% to about 2.0%, and most preferably from about 0.75% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and, preferably, dioctylphthalate. The plasticizer is preferably present in the composition of this invention in an amount of from about 0.5% to about 1.25% by weight, although the skilled artisan may use more or less as desired.

Colorants useful herein include dyes such as Rhodamine, Chalcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a coating composition for the production of lithographic printing plates, the composition of this invention may be dispersed in admixture in a solvent or mixture of solvents to facilitate application of the composition to the substrate. Suitable solvents for this purpose include tetrahydrofuran, propylene glycol monomethyl ether, butyrolactone, methyl cellosolve, ethylene glycol ethers, alcohols such as ethyl alcohol and n-propanol, and ketones such as methyl ethyl ketone, or mixtures thereof. Preferably, the solvent comprises a mixture of tetrahydrofuran, propylene glycol monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electrolyte solution comprising hydrochloric acid. The grained plate is preferably then anodized for example in sulfuric or phosphoric acid in a manner well known in the art. The grained and anodized surface is preferably then rendered hydrophilic by treatment with polyvinyl phosphonic acid by means which are also known to the skilled artisan. The thusly prepared plate is then coated with the composition of the present invention, preferably at a coating weight of from about 0.6 g/m$^2$ to about 2.5 g/m$^2$, more preferably from about 0.8 g/m$^2$ to about 2.0 g/m$^2$ and most preferably from about 1.2 g/m$^2$ to about 1.5 g/m$^2$, although these coating weights are not critical to the practice of this invention, and dried.

Preferably the thusly prepared lithographic printing plate is exposed to actinic radiation through a negative test flat so as to yield a solid 6 on a 21 step Stouffer exposure wedge after development. The exposed plate is then developed with a suitable developer composition, preferably an orgainc solvent based developer, such as one comprising 2-propoxyethanol, a nonionic surfactant and an inorganic salt such as is disclosed in U.S. Pat. Nos. 4,308,340 and 4,381,340. Another suitable organic solvent based developer composition is one containing propoxymethanol. In conventional use, the developed plate is finished with a subtractive finisher such as a hydrophilic polymer. Examples include cold water-soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat. No. 4,355,096, the disclosure of which is hereby incorporated herein by reference. The thusly prepared plate is then heat treated by baking at a temperature of from about 180° C. up to the annealing temperature of the substrate, most preferably about 240° C. The effective baking time is inversely proportional to the temperature and averages in the range of from about 2 to about 15 minutes. At 240° C. the time is about 7 minutes.

The following examples are illustrative of the invention but it is understood that the invention is not limited thereto. None of the plates plates prepared in Examples 1–7 have an oxygen barrier layer thereon nor were they processed in a nitrogen barrier environment.

EXAMPLE 1

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m$^2$. The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
|---|---|
| A terpolymer of polyvinyl acetate, polyvinyl alcohol and polyvinyl formal commercially available as Formvar 12/85 | 4.54 |
| Pentaerythritol tetraacrylate | 2.81 |
| Glycidyl acrylate | 1.21 |
| Polycondensation product of 3-methoxy-4-diazo-diphenyl amine sulfate and 4,4-bis-methoxy methyl diphenyl ether isolated as the mesitylene sulfonate | 1.22 |
| 2-Stilbenyl-4,6-di(trichloromethyl)triazine | 3.20 |
| Methyl cellosolve | Balance |

The coated and dried plate is exposed to actinic radiation through a negative exposure flat so as to yield a solid seven on a 21 step Stouffer step wedge. The plate is developed using the following composition

|  | % w/w |
|---|---|
| 2-propoxy ethanol | 14.85 |
| n-propanol | 11.15 |
| MgSO$_4$.7H$_2$O | 8.00 |
| NaH$_2$PO$_4$ (anhydrous) | 1.50 |
| Polyvinyl pyrrolidone* | 1.50 |
| Trycol OP-407** | 0.75 |
| polyethylene glycol 200 | 1.00 |
| H$_2$O | Balance |

*MW = 10,000
**nonyl phenol polyoxyethylene ethanol; 40 moles ethylene oxide as a 70% solution in H$_2$O.

and finished with the following composition

|  | % w/w |
|---|---|
| Dextrin*** | 5.52 |
| sodium octyl sulfate | 1.61 |
| Triton X-100**** | 1.00 |
| Givgaurd DXN***** | 0.05 |
| H$_3$PO$_4$ | 2.37 |
| H$_2$O | Balance |

***hydrolyzed tapioca dextrin
****isooctyl phenol polyoxyethylene ethanol; 4.5 moles ethylene oxide
*****1,4-dimethyl-6-acetoxy-dioxane and run on a Solna sheet fed press using abrasive ink, over-packing, and a Dahlgren dampening system until image breakdown is achieved. Under these conditions the plate provides 495,000 acceptable impressions.

EXAMPLE 2

A lithographic printing plate is prepared and processed as described in Example 1 except that the glycidyl acrylate is omitted. Under these conditions the plate provides only 300,000 acceptable impressions.

EXAMPLE 3

In like manner as described in Example 1, a plate is prepared by applying the coating solution given except that the glycidyl acrylate was replaced with cyclohexyl acrylate. Under the test conditions, as described, the plate provides 480,000 acceptable impressions.

EXAMPLE 4

Example 3 is repeated except that the cyclohexyl acrylate is omitted from the coating. Under the test conditions, as described, the plate provides 305,000 acceptable impressions.

EXAMPLE 5

A lithographic printing plate is prepared and processed as described in Example 1 except that the plate is whirler coated with a solution having the following composition:

|  | % w/w |
|---|---|
| A terpolymer of polvinyl acetate, polyvinyl alcohol and polyvinyl formal commercially available as Formvar 12/85 | 4.54 |
| A mixture of polyfunctional acrylates consisting of 73% pentaerythritol tetracrylate, 22% pentaerythritol triacrylate and 5% pentaerythritol diacrylate | 3.90 |
| Pentaerithritol acrylate | 0.12 |
| Polycondensation product of 3-methoxy-4-diazo-diphenyl amine sulfate and 4,4-bis-methoxy methyl diphenyl ether isolated as the mesitylene sulfonate | 1.22 |
| 2-Stilbenyl-4,6-di(trichloromethyl)triazine | 3.20 |
| Methyl cellosolve | Balance |

Under these conditions the plate provides 540,000 acceptable impressions.

EXAMPLE 6

A lithographic printing plate is prepared and processed as described in Example 1 except that the plate is whirler coated with a solution having the following composition:

| | % w/w |
|---|---|
| A terpolymer of polyvinyl acetate, polyvinyl alcohol and polyvinyl formal commercially available as Formvar 12/85 | 4.54 |
| Pentaerythritol tetraacrylate | 2.81 |
| Polycondensation product of 3-methoxy-4-diazo-diphenyl amine sulfate and 4,4-bis-methoxy methyl diphenyl ether isolated as the mesitylene sulfonate | 1.22 |
| 2-Stilbenyl-4,6-di(trichloromethyl)triazine | 3.20 |
| Methyl cellosolve | Balance |

Under these conditions the plate provides only 315,000 acceptable impressions.

EXAMPLE 7

A lithographic printing plate is prepared and processed as described in Example 5 except that the 2-stilbenyl-4,6-di-(trichloromethyl)triazine is omitted. Under these conditions the plate provides only 335,000 acceptable impressions.

It can be readily observed that plates prepared according to this invention (Examples 1, 3 and 5) show substantially increased press runs.

We claim:

1. A radiation-polymerizable composition comprising in admixture
   a. a polymeric binder in sufficient amount to bind the composition components in a cohesive matrix;
   b. a photoinitiator in sufficient amount to initiate the free-radical polymerization of the photopolymerizable mixture
   c. a light sensitive diazonium salt in sufficient amount to insolubilize upon exposure to sufficient actinic radiation; and
   d. a photopolymerizable mixture of
      (i) more than about 50% by weight of the photopolymerizable mixture of a polyfunctional acrylic monomer having from 3 to 6 unsaturated groups; and
      (ii) from about 1% to about 50% by weight of the photopolymerizable mixture of a monofunctional acrylic monomer having 1 unsaturated group; and wherein the polyfunctional acrylic monomer is capable of reacting with the monofunctional acrylic monomer upon exposure to imaging radiation; and wherein the polymerizable mixture is present in sufficient amount to provide a tough image matrix upon exposure to imaging radiation.

2. The composition of claim 1 wherein said polyfunctional monomer is further characterized as having the unsaturated groups being acrylate or methacrylate esters.

3. The composition of claim 2 wherein said polyfunctional monomer is pentaerythritol tetraacrylate.

4. The composition of claim 1 wherein said monofunctional monomer is further characterized as having the unsaturated group be an acrylate or methacrylate ester.

5. The composition of claim 4 wherein said monofunctional monomer is pentaerythritol acrylate.

6. The composition of claim 1 wherein said photopolymerizable mixture is present in said composition in an amount of from about 20% to about 70% by weight.

7. The composition of claim 6 wherein said photopolymerizable mixture is present in said composition in an amount of from about 30% to about 60% by weight.

8. The composition of claim 7 wherein said photopolymerizable mixture is present in said composition in an amount of from about 30% to about 50% by weight.

9. The composition of claim 1 wherein said polyfunctional monomer is present in said photopolymerizable mixture in an amount more than about 50% by weight.

10. The composition of claim 9 wherein said polyfunctional monomer is present in said photopolymerizable mixture in an amount of from about 65% to about 99% by weight.

11. The composition of claim 1 wherein said monofunctional monomer is present in said photopolymerizable mixture in an amount of less than about 50% by weight.

12. The composition of claim 11 wherein said monofunctional monomer is present in said photopolymerizable mixture in an amount of from about 1% to about 35% by weight.

13. The composition of claim 1 wherein said polymeric binder is selected from the group consisting of epoxy resins, polyvinyl acetates, polyvinyl formals, polyvinyl butyrals, polyesters, polyamides, polyethers, polyurethanes and polyacrylic resins, and copolymers or terpolymers of any of these.

14. The composition of claim 13 wherein said polymeric binder comprises a terpolymer of polyvinyl acetate, polyvinyl alcohol and polyvinyl acetal.

15. The composition of claim 1 wherein said photoinitiator comprises a triazine compound.

16. The composition of claim 15 wherein said photoinitiator comprises a bis-trichloromethyl triazine having the formula

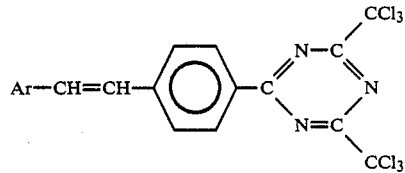

wherein Ar is

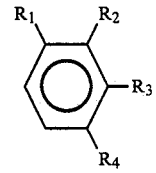

and $R_1$, $R_2$, $R_3$ and $R_4$ are, independently, hydrogen, chlorine, bromine, alkoxy, alkyl ketone, naphthyl or anthracyl.

17. The composition of claim 16 wherein said photoinitiator is 2-stilbenyl-4,6-di(trichloromethyl)triazine.

18. The composition of claim 1 wherein said diazonium salt comprises the condensation product of 3-methoxy-4-diazo-diphenylamine sulfate and 4,4'-bismethoxymethyl diphenyl ether isolated as the mesitylene sulfonate.

19. The composition of claim 1 wherein said diazonium salt comprises the condensation product of 4,4'-bis-methoxymethyl diphenyl ether, which is first precondensed with itself to form an oligomer having from 2 to 7 repeating units, and 3-methoxy-4-diazo-diphenylamine sulfate.

20. A photographic element comprising a substrate upon which the composition of claim 1 is coated.

21. The photographic element of claim 20 wherein said substrate is selected from the group consisting of aluminum and its alloys, polyester and silicon.

22. The photographic element of claim 21 wherein said substrate comprises aluminum and its alloys.

23. The photographic element of claim 20 wherein said polyfunctional monomer is further characterized as having the unsaturated groups being acrylate or methacrylate esters.

24. The photographic element of claim 23 wherein said polyfunctional monomer is pentaerythritol tetraacrylate.

25. The photographic element of claim 20 wherein said monofunctional monomer is further characterized as having the unsaturated group be an acrylate or methacrylate ester.

26. The photographic element of claim 25 wherein said monofunctional monomer is pentaerythritol acrylate.

27. The photographic element of claim 20 wherein said polymeric binder comprises a terpolymer of polyvinyl acetate, polyvinyl alcohol and polyvinyl acetal, said photoinitiator comprises a triazine composition and said diazonium salt comprises the condensation product of 3-methoxy-4-diazo-diphenylamine sulfate and 4,4'-bismethoxy-methyl diphenyl ether isolated as the mesitylene sulfonate.

28. A photographic element comprising an aluminum containing substrate upon which is coated a composition comprising in admixture
 (a) a terpolymer of polyvinyl acetate, polyvinyl alcohol and polyvinyl formal in sufficient amount to bind the composition components in a cohesive matrix;
 (b) from about 1.5% to about 8% based on the weight of the solid components of the composition of 2-stilbenyl-4,6-di(trichloromethyl) triazine;
 (c) from about 3% to about 20% based on the weight of the solid components of the composition of the condensation product of 3-methoxy-4-diazo-diphenylamine sulfate and 4,4'-bis-methoxymethyl diphenyl ether isolated as the mesitylene sulfonate; and
 (d) from about 20% to about 70% based on the weight of the solid components of the composition of a photopolymerizable mixture of
  (i) pentaerythritol tetraacrylate; and
  (ii) pentaerythritol acrylate;
 wherein said component (i) is present in an amount of from about 50% to about 97.5% based on the weight of the photopolymerizable mixture.

29. A process for the production of a photographic element comprising combining an admixture of:
 a. a polymeric binder in sufficient amount to bind the admixture components in a cohesive matrix;
 b. a photoinitiator in sufficient amount to initiate the free-radical polymerization of the photopolymerizable mixture;
 c. a light sensitive diazonium salt in sufficient amount to insolubilize upon exposure to sufficient actinic radiation; and
 d. a photopolymerizable mixture of
  (i) more than about 50% by weight of the photopolymerizable mixture of a polyfunctional acrylic monomer having from 3 to 6 unsaturated groups; and
  (ii) from about 1% to about 50% by weight of the photopolymerizable mixture of a monofunctional acrylic monomer having 1 unsaturated group; and
 e. one or more solvents selected from the group consisting of tetrahydrofuran, propylene glycol monomethyl ether, butyrolactone, methyl cellosolve, ethylene glycol ethers, alcohols and ketones, in an amount sufficient to disperse the admixture components; wherein the polyfunctional acrylic monomer is capable of reacting with the monofunctional acrylic monomer upon exposure to imaging radiation; and wherein the polymerizable mixture is present in sufficient amount to provide a tough image matrix upon exposure to imaging radiation; and coating said admixture on a substrate; and drying said admixture.

30. The process of claim 29 wherein said substrate is selected from the group consisting of aluminum and its alloys, polyester and silicon.

31. The process of claim 30 wherein said substrate comprises aluminum and its alloys.

* * * * *